United States Patent [19]
Adachi

[11] Patent Number: 5,982,307
[45] Date of Patent: Nov. 9, 1999

[54] CODE TRANSLATION CIRCUIT FOR CONVERTING A BINARY DATA TO A BINARY CODED DECIMAL DATA

[75] Inventor: Satoshi Adachi, Kawasaki, Japan

[73] Assignee: Mitutoyo Corporation, Kawasaki, Japan

[21] Appl. No.: 08/891,642

[22] Filed: Jul. 11, 1997

[30] Foreign Application Priority Data

Jul. 17, 1996 [JP] Japan .................................. 8-187761

[51] Int. Cl.⁶ .................................................. H03M 7/12
[52] U.S. Cl. .............................................. 341/84; 341/85
[58] Field of Search ................................ 341/84, 85, 62, 341/105

[56] References Cited

U.S. PATENT DOCUMENTS

| | | | |
|---|---|---|---|
| 3,564,225 | 2/1971 | Watson, Jr. ........................... | 341/84 |
| 3,624,374 | 11/1971 | Steiner ................................... | 341/84 |
| 4,068,227 | 1/1978 | Graham ................................. | 341/57 |
| 4,069,478 | 1/1978 | Miller .................................... | 341/84 |
| 4,103,234 | 7/1978 | Frazier, Jr. ............................ | 341/57 |

*Primary Examiner*—Brian Young
*Assistant Examiner*—Peguy JeanPierre
*Attorney, Agent, or Firm*—Oliff & Berridge, PLC

[57] ABSTRACT

The first shift-register 1 has 4 bits×N stages for storing the operated result BCD data 4 bits by 4 bits from LSD. The second shift-register 2 has 4 bits×M stages for storing a BIN data to be translated 4 bits by 4 bits from MSD. The D-F/F 5 is to store the output from the first shift-register 1 and the intermediate result, and output thereof is supplied to the arithmetic/logic circuit 6 through the first selector 3. The output of the second shift-register 2 is selected by the second selector 4 to be supplied to the arithmetic/logic circuit 6. The arithmetic/logic circuit 6 performs×16 operation for the stored data in the shift register 1, and adding the resultant to 4 bits data stored in the shift-register 2 with carry process. The output DO of the arithmetic/logic circuit 6 is stored in the D-F/F 5 in the first half of the shift clock SCK1, and stored in the shift-register 1 in the latter half of the shift clock SCK1. The shift-register 1 makes a round, while the shift-register 2 is 1 stage shifted.

5 Claims, 19 Drawing Sheets

FIG. 3

| INPUT | | | | | OUTPUT | | | | | |
|---|---|---|---|---|---|---|---|---|---|---|
| DA3 | DA2 | DA1 | DA0 | | DC0$_{n+1}$ | DC3$_n$ | DC2$_n$ | DC1$_n$ | DC0$_n$ | |
| 0 | 0 | 0 | 0 | (0) | 0 | 0 | 0 | 0 | 0 | (0) |
| 0 | 0 | 0 | 1 | (1) | 0 | 0 | 0 | 1 | 0 | (2) |
| 0 | 0 | 1 | 0 | (2) | 0 | 0 | 1 | 0 | 0 | (4) |
| 0 | 0 | 1 | 1 | (3) | 0 | 0 | 1 | 1 | 0 | (6) |
| 0 | 1 | 0 | 0 | (4) | 0 | 1 | 0 | 0 | 0 | (8) |
| 0 | 1 | 0 | 1 | (5) | 1 | 0 | 0 | 0 | 0 | (10) |
| 0 | 1 | 1 | 0 | (6) | 1 | 0 | 0 | 1 | 0 | (12) |
| 0 | 1 | 1 | 1 | (7) | 1 | 0 | 1 | 0 | 0 | (14) |
| 1 | 0 | 0 | 0 | (8) | 1 | 0 | 1 | 1 | 0 | (16) |
| 1 | 0 | 0 | 1 | (9) | 1 | 1 | 0 | 0 | 0 | (18) |

FIG. 5

| INPUT a | INPUT b | OUTPUT | C2 | C1 |
|---|---|---|---|---|
| 0 0 0 0 (0) | 0 0 0 0 (0) | 0 0 0 0 (0) | 0 | 0 |
| 0 0 0 0 (0) | 0 0 0 1 (1) | 0 0 0 1 (1) | 0 | 0 |
| 0 0 0 0 (0) | 0 0 1 0 (2) | 0 0 1 0 (2) | 0 | 0 |
| 0 0 0 0 (0) | 0 0 1 1 (3) | 0 0 1 1 (3) | 0 | 0 |
| 0 0 0 0 (0) | 0 1 0 0 (4) | 0 1 0 0 (4) | 0 | 0 |
| 0 0 0 0 (0) | 0 1 0 1 (5) | 0 1 0 1 (5) | 0 | 0 |
| 0 0 0 0 (0) | 0 1 1 0 (6) | 0 1 1 0 (6) | 0 | 0 |
| 0 0 0 0 (0) | 0 1 1 1 (7) | 0 1 1 1 (7) | 0 | 0 |
| 0 0 0 0 (0) | 1 0 0 0 (8) | 1 0 0 0 (8) | 0 | 0 |
| 0 0 0 0 (0) | 1 0 0 1 (9) | 1 0 0 1 (9) | 0 | 0 |
| 0 0 0 0 (0) | 1 0 1 0 (A) | 0 0 0 0 (0) | 0 | 1 |
| 0 0 0 0 (0) | 1 0 1 1 (B) | 0 0 0 1 (1) | 0 | 1 |
| 0 0 0 0 (0) | 1 1 0 0 (C) | 0 0 1 0 (2) | 0 | 1 |
| 0 0 0 0 (0) | 1 1 0 1 (D) | 0 0 1 1 (3) | 0 | 1 |
| 0 0 0 0 (0) | 1 1 1 0 (E) | 0 1 0 0 (4) | 0 | 1 |
| 0 0 0 0 (0) | 1 1 1 1 (F) | 0 1 0 1 (5) | 0 | 1 |
| 0 0 0 1 (1) | 0 0 0 0 (0) | 0 0 0 1 (1) | 0 | 0 |
| 0 0 0 1 (1) | 0 0 0 1 (1) | 0 0 1 0 (2) | 0 | 0 |
| 0 0 0 1 (1) | 0 0 1 0 (2) | 0 0 1 1 (3) | 0 | 0 |
| 0 0 0 1 (1) | 0 0 1 1 (3) | 0 1 0 0 (4) | 0 | 0 |
| 0 0 0 1 (1) | 0 1 0 0 (4) | 0 1 0 1 (5) | 0 | 0 |
| 0 0 0 1 (1) | 0 1 0 1 (5) | 0 1 1 0 (6) | 0 | 0 |
| 0 0 0 1 (1) | 0 1 1 0 (6) | 0 1 1 1 (7) | 0 | 0 |
| 0 0 0 1 (1) | 0 1 1 1 (7) | 1 0 0 0 (8) | 0 | 0 |
| 0 0 0 1 (1) | 1 0 0 0 (8) | 1 0 0 1 (9) | 0 | 0 |
| 0 0 0 1 (1) | 1 0 0 1 (9) | 0 0 0 0 (0) | 0 | 1 |
| 0 0 0 1 (1) | 1 0 1 0 (A) | 0 0 0 1 (1) | 0 | 1 |
| 0 0 0 1 (1) | 1 0 1 1 (B) | 0 0 1 0 (2) | 0 | 1 |
| 0 0 0 1 (1) | 1 1 0 0 (C) | 0 0 1 1 (3) | 0 | 1 |
| 0 0 0 1 (1) | 1 1 0 1 (D) | 0 1 0 0 (4) | 0 | 1 |
| 0 0 0 1 (1) | 1 1 1 0 (E) | 0 1 0 1 (5) | 0 | 1 |
| 0 0 1 0 (1) | 1 1 1 1 (F) | 0 1 1 0 (6) | 0 | 1 |
| 0 0 1 0 (2) | 0 0 0 0 (0) | 0 0 1 0 (2) | 0 | 0 |
| 0 0 1 0 (2) | 0 0 0 1 (1) | 0 0 1 1 (3) | 0 | 0 |
| 0 0 1 0 (2) | 0 0 1 0 (2) | 0 1 0 0 (4) | 0 | 0 |
| 0 0 1 0 (2) | 0 0 1 1 (3) | 0 1 0 1 (5) | 0 | 0 |
| 0 0 1 0 (2) | 0 1 0 0 (4) | 0 1 1 0 (6) | 0 | 0 |
| 0 0 1 0 (2) | 0 1 0 1 (5) | 0 1 1 1 (7) | 0 | 0 |
| 0 0 1 0 (2) | 0 1 1 0 (6) | 1 0 0 0 (8) | 0 | 0 |
| 0 0 1 0 (2) | 0 1 1 1 (7) | 1 0 0 1 (9) | 0 | 0 |

FIG. 6

| INPUT a | INPUT b | OUTPUT | C 2 | C 1 |
|---|---|---|---|---|
| 0 0 1 0 (2) | 1 0 0 0 (8) | 0 0 0 0 (0) | 0 | 1 |
| 0 0 1 0 (2) | 1 0 0 1 (9) | 0 0 0 1 (1) | 0 | 1 |
| 0 0 1 0 (2) | 1 0 1 0 (A) | 0 0 1 0 (2) | 0 | 1 |
| 0 0 1 0 (2) | 1 0 1 1 (B) | 0 0 1 1 (3) | 0 | 1 |
| 0 0 1 0 (2) | 1 1 0 0 (C) | 0 1 0 0 (4) | 0 | 1 |
| 0 0 1 0 (2) | 1 1 0 1 (D) | 0 1 0 1 (5) | 0 | 1 |
| 0 0 1 0 (2) | 1 1 1 0 (E) | 0 1 1 0 (6) | 0 | 1 |
| 0 0 1 0 (2) | 1 1 1 1 (F) | 0 1 1 1 (7) | 0 | 1 |
| 0 0 1 1 (3) | 0 0 0 0 (0) | 0 0 1 1 (3) | 0 | 0 |
| 0 0 1 1 (3) | 0 0 0 1 (1) | 0 1 0 0 (4) | 0 | 0 |
| 0 0 1 1 (3) | 0 0 1 0 (2) | 0 1 0 1 (5) | 0 | 0 |
| 0 0 1 1 (3) | 0 0 1 1 (3) | 0 1 1 0 (6) | 0 | 0 |
| 0 0 1 1 (3) | 0 1 0 0 (4) | 0 1 1 1 (7) | 0 | 0 |
| 0 0 1 1 (3) | 0 1 0 1 (5) | 1 0 0 0 (8) | 0 | 0 |
| 0 0 1 1 (3) | 0 1 1 0 (6) | 1 0 0 1 (9) | 0 | 0 |
| 0 0 1 1 (3) | 0 1 1 1 (7) | 0 0 0 0 (0) | 0 | 1 |
| 0 0 1 1 (3) | 1 0 0 0 (8) | 0 0 0 1 (1) | 0 | 1 |
| 0 0 1 1 (3) | 1 0 0 1 (9) | 0 0 1 0 (2) | 0 | 1 |
| 0 0 1 1 (3) | 1 0 1 0 (A) | 0 0 1 1 (3) | 0 | 1 |
| 0 0 1 1 (3) | 1 0 1 1 (B) | 0 1 0 0 (4) | 0 | 1 |
| 0 0 1 1 (3) | 1 1 0 0 (C) | 0 1 0 1 (5) | 0 | 1 |
| 0 0 1 1 (3) | 1 1 0 1 (D) | 0 1 1 0 (6) | 0 | 1 |
| 0 0 1 1 (3) | 1 1 1 0 (E) | 0 1 1 1 (7) | 0 | 1 |
| 0 0 1 1 (3) | 1 1 1 1 (F) | 1 0 0 0 (8) | 0 | 1 |
| 0 1 0 0 (4) | 0 0 0 0 (0) | 0 1 0 0 (4) | 0 | 0 |
| 0 1 0 0 (4) | 0 0 0 1 (1) | 0 1 0 1 (5) | 0 | 0 |
| 0 1 0 0 (4) | 0 0 1 0 (2) | 0 1 1 0 (6) | 0 | 0 |
| 0 1 0 0 (4) | 0 0 1 1 (3) | 0 1 1 1 (7) | 0 | 0 |
| 0 1 0 0 (4) | 0 1 0 0 (4) | 1 0 0 0 (8) | 0 | 0 |
| 0 1 0 0 (4) | 0 1 0 1 (5) | 1 0 0 1 (9) | 0 | 0 |
| 0 1 0 0 (4) | 0 1 1 0 (6) | 0 0 0 0 (0) | 0 | 1 |
| 0 1 0 0 (4) | 0 1 1 1 (7) | 0 0 0 1 (1) | 0 | 1 |
| 0 1 0 0 (4) | 1 0 0 0 (8) | 0 0 1 0 (2) | 0 | 1 |
| 0 1 0 0 (4) | 1 0 0 1 (9) | 0 0 1 1 (3) | 0 | 1 |
| 0 1 0 0 (4) | 1 0 1 0 (A) | 0 1 0 0 (4) | 0 | 1 |
| 0 1 0 0 (4) | 1 0 1 1 (B) | 0 1 0 1 (5) | 0 | 1 |
| 0 1 0 0 (4) | 1 1 0 0 (C) | 0 1 1 0 (6) | 0 | 1 |
| 0 1 0 0 (4) | 1 1 0 1 (D) | 0 1 1 1 (7) | 0 | 1 |
| 0 1 0 0 (4) | 1 1 1 0 (E) | 1 0 0 0 (8) | 0 | 1 |
| 0 1 0 0 (4) | 1 1 1 1 (F) | 1 0 0 1 (9) | 0 | 1 |

FIG. 7

| INPUT a | INPUT b | OUTPUT | C2 | C1 |
|---|---|---|---|---|
| 0 1 0 1 (5) | 0 0 0 0 (0) | 0 1 0 1 (5) | 0 | 0 |
| 0 1 0 1 (5) | 0 0 0 1 (1) | 0 1 1 0 (6) | 0 | 0 |
| 0 1 0 1 (5) | 0 0 1 0 (2) | 0 1 1 1 (7) | 0 | 0 |
| 0 1 0 1 (5) | 0 0 1 1 (3) | 1 0 0 0 (8) | 0 | 0 |
| 0 1 0 1 (5) | 0 1 0 0 (4) | 1 0 0 1 (9) | 0 | 0 |
| 0 1 0 1 (5) | 0 1 0 1 (5) | 0 0 0 0 (0) | 0 | 1 |
| 0 1 0 1 (5) | 0 1 1 0 (6) | 0 0 0 1 (1) | 0 | 1 |
| 0 1 0 1 (5) | 0 1 1 1 (7) | 0 0 1 0 (2) | 0 | 1 |
| 0 1 0 1 (5) | 1 0 0 0 (8) | 0 0 1 1 (3) | 0 | 1 |
| 0 1 0 1 (5) | 1 0 0 1 (9) | 0 1 0 0 (4) | 0 | 1 |
| 0 1 0 1 (5) | 1 0 1 0 (A) | 0 1 0 1 (5) | 0 | 1 |
| 0 1 0 1 (5) | 1 0 1 1 (B) | 0 1 1 0 (6) | 0 | 1 |
| 0 1 0 1 (5) | 1 1 0 0 (C) | 0 1 1 1 (7) | 0 | 1 |
| 0 1 0 1 (5) | 1 1 0 1 (D) | 1 0 0 0 (8) | 0 | 1 |
| 0 1 0 1 (5) | 1 1 1 0 (E) | 1 0 0 1 (9) | 0 | 1 |
| 0 1 0 1 (5) | 1 1 1 1 (F) | 0 0 0 0 (0) | 1 | 0 |
| 0 1 1 0 (6) | 0 0 0 0 (0) | 0 1 1 0 (6) | 0 | 0 |
| 0 1 1 0 (6) | 0 0 0 1 (1) | 0 1 1 1 (7) | 0 | 0 |
| 0 1 1 0 (6) | 0 0 1 0 (2) | 1 0 0 0 (8) | 0 | 0 |
| 0 1 1 0 (6) | 0 0 1 1 (3) | 1 0 0 1 (9) | 0 | 0 |
| 0 1 1 0 (6) | 0 1 0 0 (4) | 0 0 0 0 (0) | 0 | 1 |
| 0 1 1 0 (6) | 0 1 0 1 (5) | 0 0 0 1 (1) | 0 | 1 |
| 0 1 1 0 (6) | 0 1 1 0 (6) | 0 0 1 0 (2) | 0 | 1 |
| 0 1 1 0 (6) | 0 1 1 1 (7) | 0 0 1 1 (3) | 0 | 1 |
| 0 1 1 0 (6) | 1 0 0 0 (8) | 0 1 0 0 (4) | 0 | 1 |
| 0 1 1 0 (6) | 1 0 0 1 (9) | 0 1 0 1 (5) | 0 | 1 |
| 0 1 1 0 (6) | 1 0 1 0 (A) | 0 1 1 0 (6) | 0 | 1 |
| 0 1 1 0 (6) | 1 0 1 1 (B) | 0 1 1 1 (7) | 0 | 1 |
| 0 1 1 0 (6) | 1 1 0 0 (C) | 1 0 0 0 (8) | 0 | 1 |
| 0 1 1 0 (6) | 1 1 0 1 (D) | 1 0 0 1 (9) | 0 | 1 |
| 0 1 1 0 (6) | 1 1 1 0 (E) | 0 0 0 0 (0) | 1 | 0 |
| 0 1 1 0 (6) | 1 1 1 1 (F) | 0 0 0 1 (1) | 1 | 0 |
| 0 1 1 1 (7) | 0 0 0 0 (0) | 0 1 1 1 (7) | 0 | 0 |
| 0 1 1 1 (7) | 0 0 0 1 (1) | 1 0 0 0 (8) | 0 | 0 |
| 0 1 1 1 (7) | 0 0 1 0 (2) | 1 0 0 1 (9) | 0 | 0 |
| 0 1 1 1 (7) | 0 0 1 1 (3) | 0 0 0 0 (0) | 0 | 1 |
| 0 1 1 1 (7) | 0 1 0 0 (4) | 0 0 0 1 (1) | 0 | 1 |
| 0 1 1 1 (7) | 0 1 0 1 (5) | 0 0 1 0 (2) | 0 | 1 |
| 0 1 1 1 (7) | 0 1 1 0 (6) | 0 0 1 1 (3) | 0 | 1 |
| 0 1 1 1 (7) | 0 1 1 1 (7) | 0 1 0 0 (4) | 0 | 1 |

FIG. 8

| INPUT a | INPUT b | OUTPUT | C2 | C1 |
|---|---|---|---|---|
| 0 1 1 1 (7) | 1 0 0 0 (8) | 0 1 0 1 (5) | 0 | 1 |
| 0 1 1 1 (7) | 1 0 0 1 (9) | 0 1 1 0 (6) | 0 | 1 |
| 0 1 1 1 (7) | 1 0 1 0 (A) | 0 1 1 1 (7) | 0 | 1 |
| 0 1 1 1 (7) | 1 0 1 1 (B) | 1 0 0 0 (8) | 0 | 1 |
| 0 1 1 1 (7) | 1 1 0 0 (C) | 1 0 0 1 (9) | 0 | 1 |
| 0 1 1 1 (7) | 1 1 0 1 (D) | 0 0 0 0 (0) | 1 | 0 |
| 0 1 1 1 (7) | 1 1 1 0 (E) | 0 0 0 1 (1) | 1 | 0 |
| 0 1 1 1 (7) | 1 1 1 1 (F) | 0 0 1 0 (2) | 1 | 0 |
| 1 0 0 0 (8) | 0 0 0 0 (0) | 1 0 0 0 (8) | 0 | 0 |
| 1 0 0 0 (8) | 0 0 0 1 (1) | 1 0 0 1 (9) | 0 | 0 |
| 1 0 0 0 (8) | 0 0 1 0 (2) | 0 0 0 0 (0) | 0 | 1 |
| 1 0 0 0 (8) | 0 0 1 1 (3) | 0 0 0 1 (1) | 0 | 1 |
| 1 0 0 0 (8) | 0 1 0 0 (4) | 0 0 1 0 (2) | 0 | 1 |
| 1 0 0 0 (8) | 0 1 0 1 (5) | 0 0 1 1 (3) | 0 | 1 |
| 1 0 0 0 (8) | 0 1 1 0 (6) | 0 1 0 0 (4) | 0 | 1 |
| 1 0 0 0 (8) | 0 1 1 1 (7) | 0 1 0 1 (5) | 0 | 1 |
| 1 0 0 0 (8) | 1 0 0 0 (8) | 0 1 1 0 (6) | 0 | 1 |
| 1 0 0 0 (8) | 1 0 0 1 (9) | 0 1 1 1 (7) | 0 | 1 |
| 1 0 0 0 (8) | 1 0 1 0 (A) | 1 0 0 0 (8) | 0 | 1 |
| 1 0 0 0 (8) | 1 0 1 1 (B) | 1 0 0 1 (9) | 0 | 1 |
| 1 0 0 0 (8) | 1 1 0 0 (C) | 0 0 0 0 (0) | 1 | 0 |
| 1 0 0 0 (8) | 1 1 0 1 (D) | 0 0 0 1 (1) | 1 | 0 |
| 1 0 0 0 (8) | 1 1 1 0 (E) | 0 0 1 0 (2) | 1 | 0 |
| 1 0 0 0 (8) | 1 1 1 1 (F) | 0 0 1 1 (3) | 1 | 0 |
| 1 0 0 1 (9) | 0 0 0 0 (0) | 1 0 0 1 (9) | 0 | 0 |
| 1 0 0 1 (9) | 0 0 0 1 (1) | 0 0 0 0 (0) | 0 | 1 |
| 1 0 0 1 (9) | 0 0 1 0 (2) | 0 0 0 1 (1) | 0 | 1 |
| 1 0 0 1 (9) | 0 0 1 1 (3) | 0 0 1 0 (2) | 0 | 1 |
| 1 0 0 1 (9) | 0 1 0 0 (4) | 0 0 1 1 (3) | 0 | 1 |
| 1 0 0 1 (9) | 0 1 0 1 (5) | 0 1 0 0 (4) | 0 | 1 |
| 1 0 0 1 (9) | 0 1 1 0 (6) | 0 1 0 1 (5) | 0 | 1 |
| 1 0 0 1 (9) | 0 1 1 1 (7) | 0 1 1 0 (6) | 0 | 1 |
| 1 0 0 1 (9) | 1 0 0 0 (8) | 0 1 1 1 (7) | 0 | 1 |
| 1 0 0 1 (9) | 1 0 0 1 (9) | 1 0 0 0 (8) | 0 | 1 |
| 1 0 0 1 (9) | 1 0 1 0 (A) | 1 0 0 1 (9) | 0 | 1 |
| 1 0 0 1 (9) | 1 0 1 1 (B) | 0 0 0 0 (0) | 1 | 0 |
| 1 0 0 1 (9) | 1 1 0 0 (C) | 0 0 0 1 (1) | 1 | 0 |
| 1 0 0 1 (9) | 1 1 0 1 (D) | 0 0 1 0 (2) | 1 | 0 |
| 1 0 0 1 (9) | 1 1 1 0 (E) | 0 0 1 1 (3) | 1 | 0 |
| 1 0 0 1 (9) | 1 1 1 1 (F) | 0 1 0 0 (4) | 1 | 0 |

CODE TRANSLATION CIRCUIT FOR CONVERTING A BINARY DATA TO A BINARY CODED DECIMAL DATA

BACKGROUND OF THE INVENTION

1. Field of the Invention

The present invention relates to a code translation circuit for converting a binary data, which is used for displaying an operation result and so on, to a binary coded decimal data Hereinafter, in this specification, "binary" data and "binary coded decimal" data are referred to as "BIN" data and "BCD" data, respectively.

2. Prior Art

Conventionally, a digital operation is processed in a BIN data format, and then the resultant is converted to a BCD data for display, because of that the BCD data is clearly in aid of human recognition. Accordingly, various code translation circuits for converting BIN data to BCD data have been developed.

Such a code translation circuit usually performs a translation process for each bit of the BIN data. For example, for converting (n+1) bits BIN data $b_n \ldots b_1 b_0$ to a BCD data, plural calculations with decimal correction are sequentially performed for each parenthesized term in the following expression (1).

$$D = b_n \times 2^n + b_{n-1} \times 2^{n-1} + \ldots + b_2 \times 2^2 + b_1 \times 2^1 + b_o = ((\ldots (b_n \times 2 + b_{n-1}) \times 2 + \ldots) \times 2 + b_1) \times 2 + b_o \quad \ldots (1)$$

For example, when each 4 bits of a BCD data is parenthesized, the decimal correction may be performed as follows. When a carry signal is generated in each 4 bits data or each 4 bits data is over 10 as a result of operation for each parenthesized terms in the above BIN data, the decimal correction is performed in such a manner that $\lceil 0111(6) \rceil$ is added to the 4 bits data. In the expression of $\lceil 0110(6) \rceil$, the parenthesized number 6 is expressed by a hexadecimal number system or a decimal system. Hereinafter, similar expressions will be used.

In details, when a BIN data $\lceil 1000\ 1101\ (8D) \rceil$ is converted to a BCD data $\lceil 0001\ 0100\ 0001(141) \rceil$, the following sequential operations are performed as shown in the following table 1.

TABLE 1

| | | | | | | |
|---|---|---|---|---|---|---|
| ① | $0 \times 2 + b_7(1)$ → | 0000 | 0000 | 0001 | | |
| ② | ① $\times 2 + b_6(0)$ → | 0000 | 0000 | 0010 | | |
| ③ | ② $\times 2 + b_5(0)$ → | 0000 | 0000 | 0100 | | |
| ④ | ③ $\times 2 + b_4(0)$ → | 0000 | 0000 | 1000 | | |
| ⑤ | ④ $\times 2 + b^3(1)$ → | 0000 | 000▓ | 0001 | (carry generation) | |
| | +) | | | 0110 | (decimal correction) | |
| | | 0000 | 0001 | 0111 | | |
| ⑥ | ⑤ $\times 2 + b^2(1)$ → | 0000 | 0010 | ▓▓▓▓ | ($\geq 10$) | |
| | +) | | | 0110 | (decimal correction) | |
| | | 0000 | 0011 | 0101 | | |

TABLE 1-continued

| | | | | | | |
|---|---|---|---|---|---|---|
| ⑦ | ⑥ $\times 2 + b^1(0)$ → | 0000 | 0110 | ▓▓▓▓ | ($\geq 10$) | |
| | +) | | | 0110 | (decimal correction) | |
| | | 0000 | 0111 | 0000 | | |
| ⑧ | ⑦ $\times 2 + b^0(1)$ → | 0000 | ▓▓▓▓ | 0001 | ($\geq 10$) | |
| | +) | | | 0110 | (decimal correction) | |
| | RESULT → | 0001 | 0100 | 0001 | (141) | |

As described above, although the converting procedure is simple in the conventional BIN-to-BCD converter, it is necessary to perform (n+1) operations for (n+1) bits BIN data. Therefore, operation time is long, and power consumption is large because of that many shift operations must be performed in a shift-register. The fact of that operation time is long brings a high operation frequency, whereby the power consumption of, for example, oscillator and the like, becomes large.

SUMMARY OF THE INVENTION

An object of the present invention is to provide a code translation circuit for converting a BIN data to a BCD data with a high-speed and low power consumption property.

According to an aspect of the present invention, the code translation circuit comprises: a first shift-register for finally storing a translated binary coded decimal data 4 bits by 4 bits from LSD (Least significant digit), the first shift-register having 4 bits×N stages (where N is an arbitrary positive integer) and being shift-controlled by a first clock signal; a second shift-register for storing a to-be-translated binary data 4 bits by 4 bits from MSD (Most Significant Digit), the second shift-register having 4 bits×M stages (where M is an arbitrary positive integer) and being shift-controlled by a second clock signal in such a manner that one stage is shifted in the second shift-register for each N stages shift in the first shift-register; arithmetic/logic means for periodically processing a code translation in such a manner as to multiply each 4 bits data sequentially selected from MSD of the to-be-translated binary data by 16 and add the resultant to the subsequent 4 bits data, thereby outputting the translated binary coded decimal data, the code translation including (a) a first process for quadrupling each 4 bits data from the first shift-register with decimal correction and carry processing to output an intermediate result in the first half of each period of the first clock signal, and (b) a second process for quadrupling each of the intermediate result with decimal correction and carry processing and adding the resultant to 4 bits data from the second shift-register so as to output the translated binary coded decimal data to be stored in the first shift-register in the latter half of each period of the first clock signal; and a buffer register for temporarily storing each of the intermediate result output from the arithmetic/logic means.

The above-mentioned expression (1) can be rewritten as the following expression (2) by parenthesizing each 4 bits.

$$D = b_n \times 2^n + b_{n-1} \times 2^{n-1} + \cdots \cdots + b_2 \times 2^2 + b_1 \times 2^1 + b_0 = \quad (2)$$
$$(((b_n b_{n-1} b_{n-2} b_{n-3}) \times 16 + b_{n-4} b_{n-5} b_{n-6} b_{n-7}) \times 16 + \cdots) \times 16 +$$

-continued $$b_3 b_2 b_1 b_0$$

If the operation for each of the parenthesized term in the expression (2) is performed in one cycle of the clock signal, it can be performed within 16 times as short time as the operation based on the expression (1). According to the present invention, quadrupling (×4) operations are performed with decimal correction and carry processing for each 4 bits data output from the first and second shift-registers in the first half and the latter half of each period of the first clock signal, respectively, whereby×16 operation is performed in each period of the first clock signal. When shift-stages of the first and second shift-registers are N and M, respectively, pulse number of the first clock signal is N×M. Since each of N and M is ¼ in comparison to the conventional circuit, the processing speed becomes 16 times as high as the conventional circuit. Further, ×16 operation is divided into the first half and the latter half of the first clock signal, whereby ×16 operation can be performed with a ×4 operation circuit. As a result, the circuit scale can be reduced.

Additionally, since the circuit of the present invention can operate with a high speed, clock signal frequency thereof can be reduced. Since the first half and the latter half of the clock signal are used for different operations, the number of the shift operations can be reduced to ½. Therefore, the power consumption can be remarkably reduced.

For example, the arithmetic/logic circuit comprises a first doubling/decimal correcting circuit for doubling 4 bits data alternately output from the first shift-register and the buffer register with decimal correction and carry processing, a second doubling/decimal correcting circuit for doubling 4 bits data output from the first decimal correcting circuit with decimal correction and carry processing, and an adding/decimal correcting circuit for adding 4 bits data output from the second decimal correcting circuit to 4 bits data output from the second shift-register or zero with decimal correction and carry processing.

In the above arithmetic/logic circuit, first and second doubling/decimal correction circuits can be composed as the same circuits. Further, the combinations of the input and output becomes less than such a decimal correction circuit with ×4 operation. As a result, the circuit can be simplified.

Each of the first and second doubling/decimal correcting circuits comprises, for example, a first carry holding portion for holding a carry signal generated by processing in the first half of a period of the first clock signal for the period of the first clock signal, then adding the carry signal to LSB of the data processed in the first half of the period in the processing of the following period of the first clock signal, and a second carry holding portion for holding a carry signal generated by processing in the latter half of a period of the first clock signal for the period of the first clock signal, then adding the carry signal to LSB of the data processed in the latter half of the period in the processing of the following period of the first clock signal. When a data is doubled, LSB thereof becomes [0]. Therefore, when the former digit (4 bits) generates a carry signal, the carry process can be performed by inputting [1] in LSB.

The data input to the arithmetic/logic circuit can be controlled by first and second selecting circuits. The first selecting circuit is driven by a first selecting signal with the same period as the first clock signal so as to alternately select the 4 bits data on the head output from the first shift-register and the intermediate date output from the buffer register, and supply the selected data to the arithmetic/logic circuit. The second selecting circuit is driven by a second selecting signal output for each N period of the first selecting signal circuit so as to select the 4 bits data on the head output from the second shift-register, and supply the selected data to the arithmetic/logic circuit.

BRIEF DESCRIPTION OF THE DRAWINGS

FIG. 3 shows a truth table of the first and second doubling/decimal correcting circuits of the arithmetic/logic circuit;

FIG. 5 shows a portion of a truth table of the adding circuit of the arithmetic/logic circuit;

FIG. 6 shows another portion of the truth table;

FIG. 7 shows another portion of the truth table;

FIG. 8 shows another portion of the truth table;

DETAILED DESCRIPTION OF THE PREFERRED EMBODIMENT

Referring to the accompanying drawings, an embodiment of the present invention will be described bellow.

Figure 1:
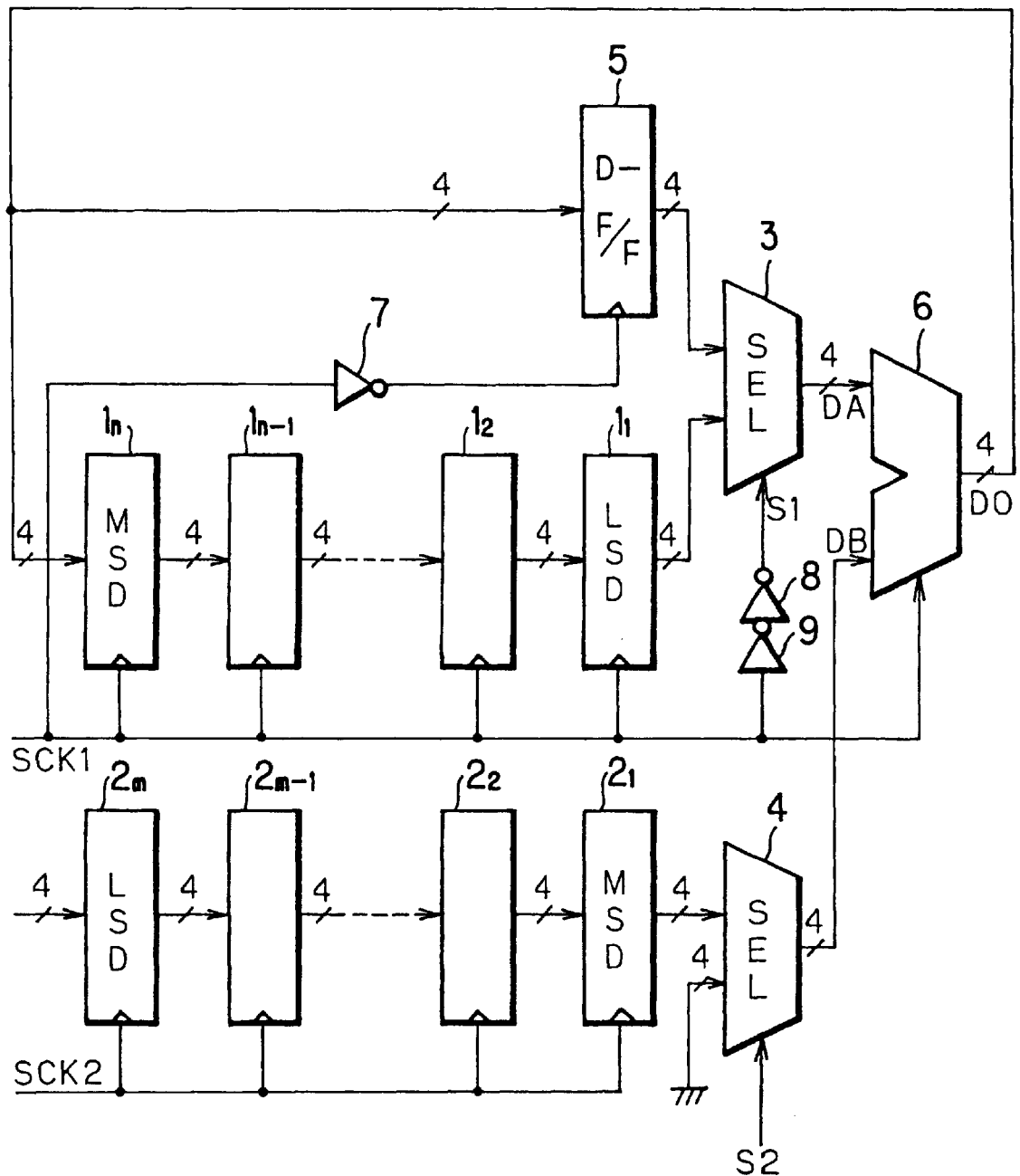
FIG. 1 shows a block diagram of a code translation circuit according to an embodiment of the present invention.

As shown in FIG. 1, a code translation circuit embodying the present invention has a first shift-register $1(1_1, 1_2, \ldots 1_N)$ with 4 bits ×N stages and a second shift-register $2(2_1, 2_2, \ldots 2_M)$ with 4 bits ×M stages, where N and M are arbitrary positive integers. The first and second shift-registers 1 and 2 are driven by a first shift clock SCK1 and a second shift clock SCK2, respectively. The first shift-register 1 is used for initially storing zero, and finally storing a translated BCD data 4 bits by 4 bits from LSD. The second shift-register 2 is used for storing a to-be-translated BIN data 4 bits by 4 bits from MSD.

The output of the first shift-register 1 is supplied to one of two input terminals of a first selector 3. The output of the second shift-register 2 is supplied to one of two input terminals of a second selector 4. A D-type flip-flop(D-F/F) 5 serves as a buffer register for temporarily storing each intermediate result in sequential translation processes. The output of the D-F/F 5 is supplied to the other input terminal of the first selector 3. To the other input terminal of the second selector 4, zero data ⌈0⌋ is supplied.

Output data DA and DB of the first and second selectors 3 and 4 are supplied to the respective input terminals of an arithmetic/logic circuit 6. The arithmetic/logic circuit 6 is to multiply each 4 bits data output from the first shift-register 1 by 16 with decimal correction and carry processing, and add the resultant to 4 bits data output from the second shift-register 2. Output data DO sequentially output from the arithmetic/logic circuit 6 4 bits by 4 bits are alternately stored in the D-F/F 5 and the first shift-register 1. Alternatively, the output data DO is stored in the D-F/F 5 in the first half of a period of the first shift clock SCK1, and stored in the first shift-register 1 in the latter half of the period of the first shift clock SCK1.

The second shift clock SCK2 is generated every N clocks of the first shift clock SCK1. Therefore, the first shift-register 1 makes a round while the second shift-register 2 operates 1-stage shift. The first shift clock SCK1 is inverted by an inverter 7 to generate a latch pulse for the D-F/F 5. As a result, a latching operation of the D-F/F 5 is shifted by a half period of the shift clock SCK1 in comparison with the shift operation of the first shift-register 1.

The shift clock SCK1 is delayed through inverters 8 and 9 to be a first selecting signal S1 for controlling the selector 3. A second selecting signal S2 for controlling the selector 4 is output at the same timing on the head of the first shift clock SCK1 for each round of the shift-register 1.

Figure 2:
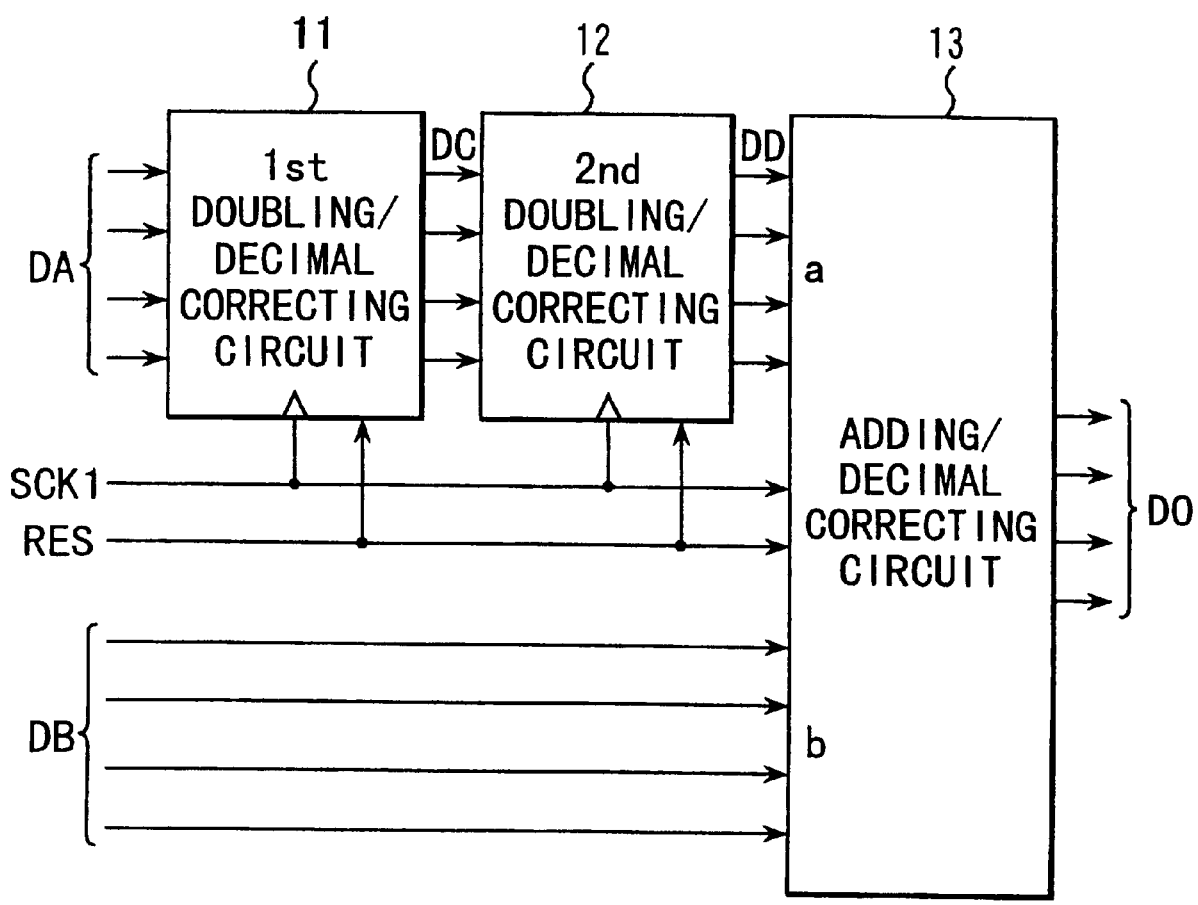
FIG. 2 shows a block diagram of an arithmetic/logic circuit of the code translation circuit.

FIG. 2 shows a block diagram of the arithmetic/logic circuit 6. As shown in FIG. 2, the arithmetic/logic circuit 6 comprises cascade-connected first and second doubling/decimal correcting circuits 11 and 12, and an adding/decimal correcting circuit 13. Each of the first and second doubling/decimal correcting circuits 11 and 12 performs doubling the data DA output from the selector 3 (i.e., ×2 operation) with carry processing and decimal correction. The adding/decimal correcting circuit 13 performs adding the output data of the second doubling/decimal correcting circuit 12 to the data DB output from the selector 4 with carry and decimal correction processing so as to output a data DO.

Each of the first and second doubling/decimal correcting circuits 11 and 12 has an input/output relationship as shown in a truth table of FIG. 3. Each 4 bits data DA and DC input to the first and second doubling/decimal correcting circuits 11 and 12, respectively, takes a value from 0000(0) to 1001(9), because of that the data DA and DC have been decimal corrected. Therefore, when the doubled data of each input data DA and DC is over ⌈9⌋, a carry signal Cn is held. If a carry signal Cn−1 in one period advanced operation is ⌈1⌋, the carry signal Cn−1=1 is added to DC0 (LSB). In other words, a carry signal is output to the following stage with a delay of one period (i.e., with one digit shift). Therefore, even if the data is output 4 bits by 4 bits, the weight of carrying accuracy can be precisely transferred.

Figure 4:
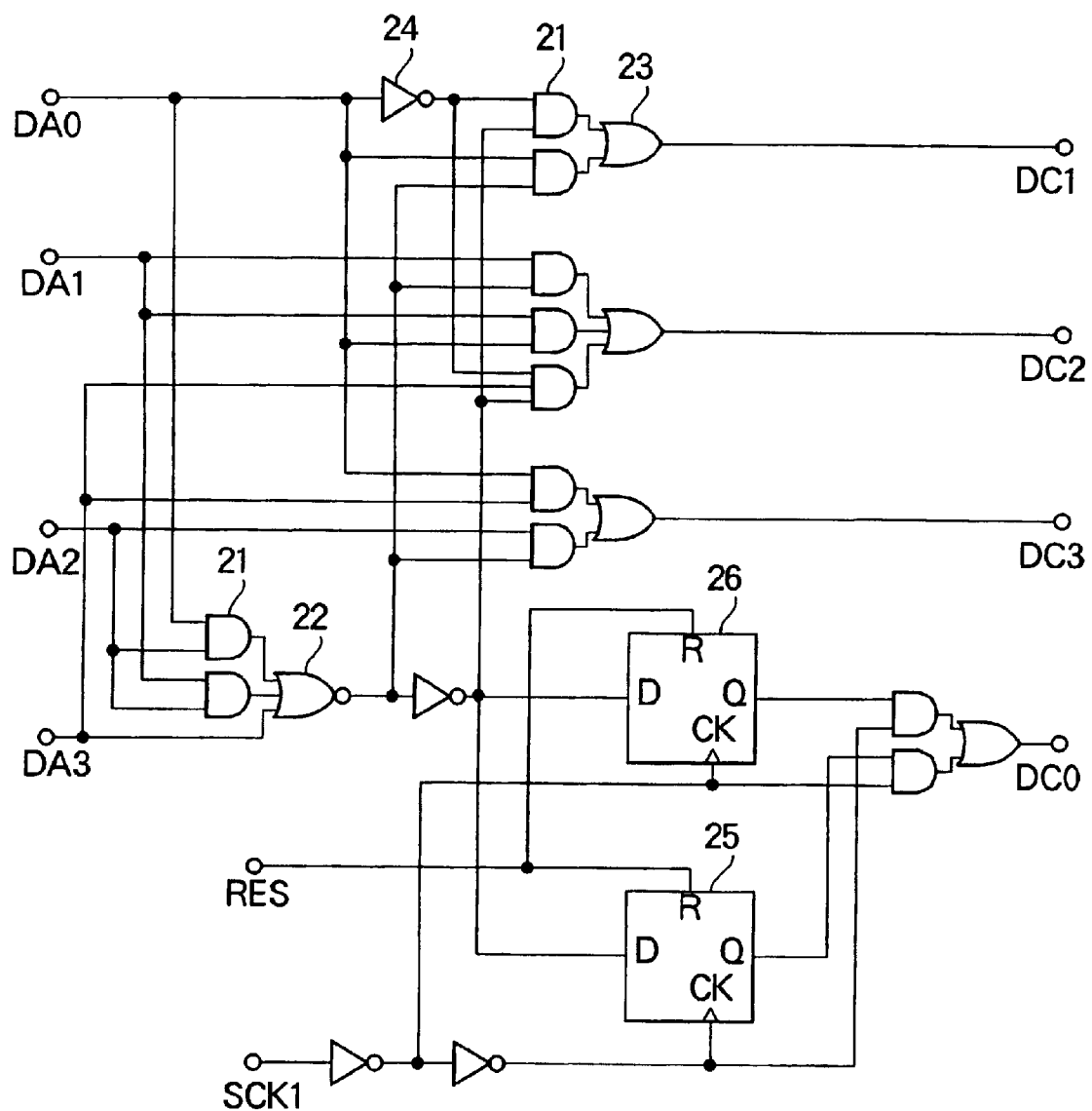
FIG. 4 shows a block diagram of the doubling/decimal correcting circuit.

Each of the first and second doubling/decimal correcting circuits 11 and 12 can be, for example as shown in FIG. 4, composed of gate circuits 21, 22, 23 and 24, and latch circuits 25, 26. The latch circuits 25 and 26 latch the carry signal Cn at the falling and rising edge timing of the first shift clock SCK1, respectively. The carry signal Cn can be reflected to the respective operation results in the first half and the latter half of the clock period, when the subsequent 4 bits data is input.

The adding/decimal correcting circuit 13 has a relationship as shown in both tables in FIG. 5 to FIG. 8. For simplifying the explanation, these tables show such a case that both carry signal C1 and C2 are 0. Since the carry signals C1 and C2 are added to the operation result, the actual combination number of the input/output is 4 times as much as the truth tables.

Figure 9:
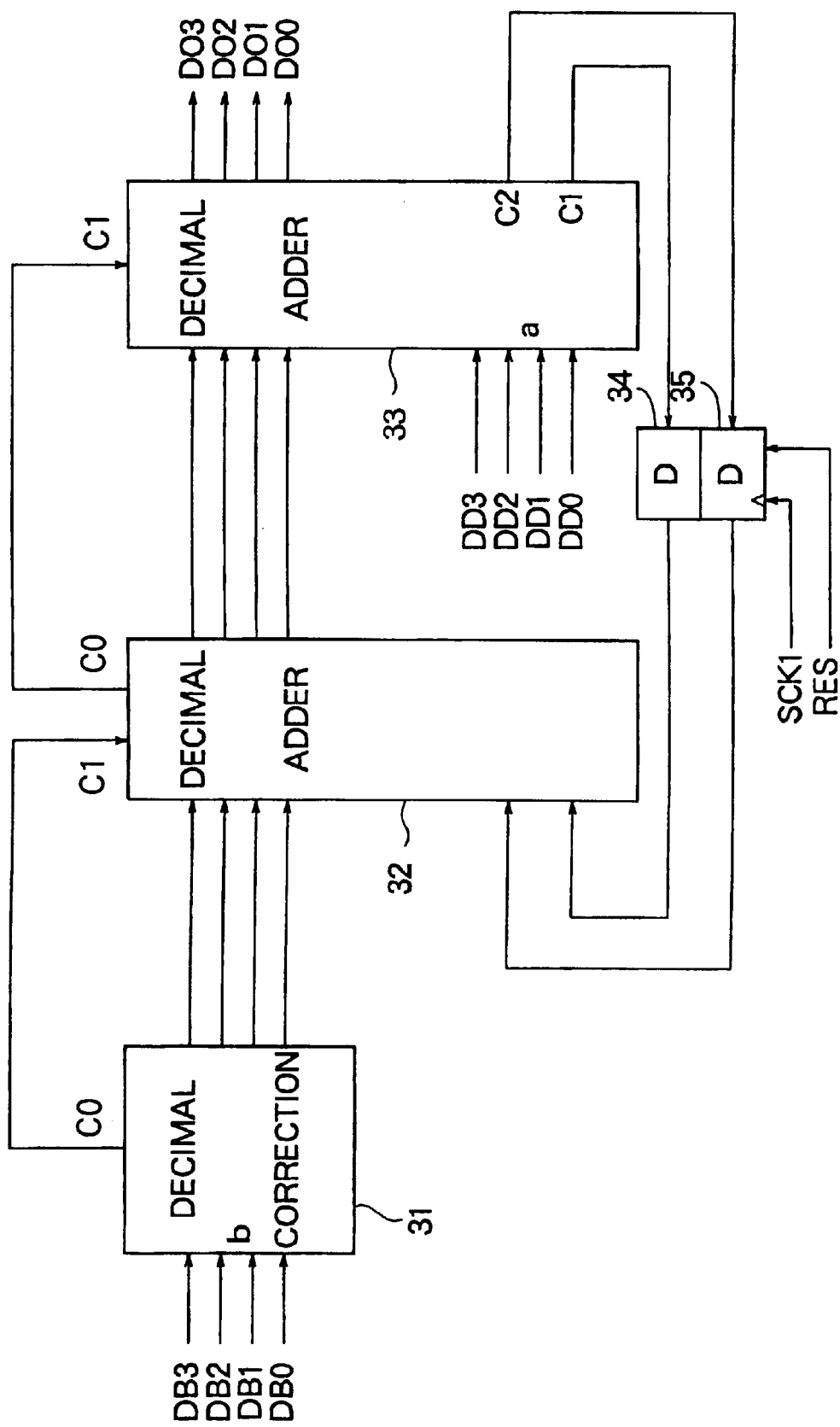
FIG. 9 shows a block diagram of the adding circuit of the arithmetic/logic circuit.

As shown in FIG. 9, the adding/decimal correcting circuit 13 can be composed of a decimal correction portion 31 and two adders 32 and 33. 4 bits data DD(DD1, DD2, DD3, DD4) on the input a takes a value from 0 to 9, because it has been decimal corrected. Data DB on the input b takes a value from 0h to Fh, because the data DB includes BIN data output from the second shift-register 2. When the data DB is over 9, the decimal correction portion 13 adds ⌈0110(6)⌋ to the data DB. Both of the adders 32 and 33 are conventional decimal adders. The input data DB is converted to a BCD data in the decimal correction portion 31, thereafter input data DD and the carry signal generated in the former operation are added to the BCD data in the decimal adders 32 and 33. Carry signals C1 and C2 generated in this processing is held in latch circuits 34 and 35, respectively, and then supplied for adding in the following operation for the subsequent digit.

Next, the detailed operation of the above-mentioned code translation circuit will be described bellow.

Figure 10:
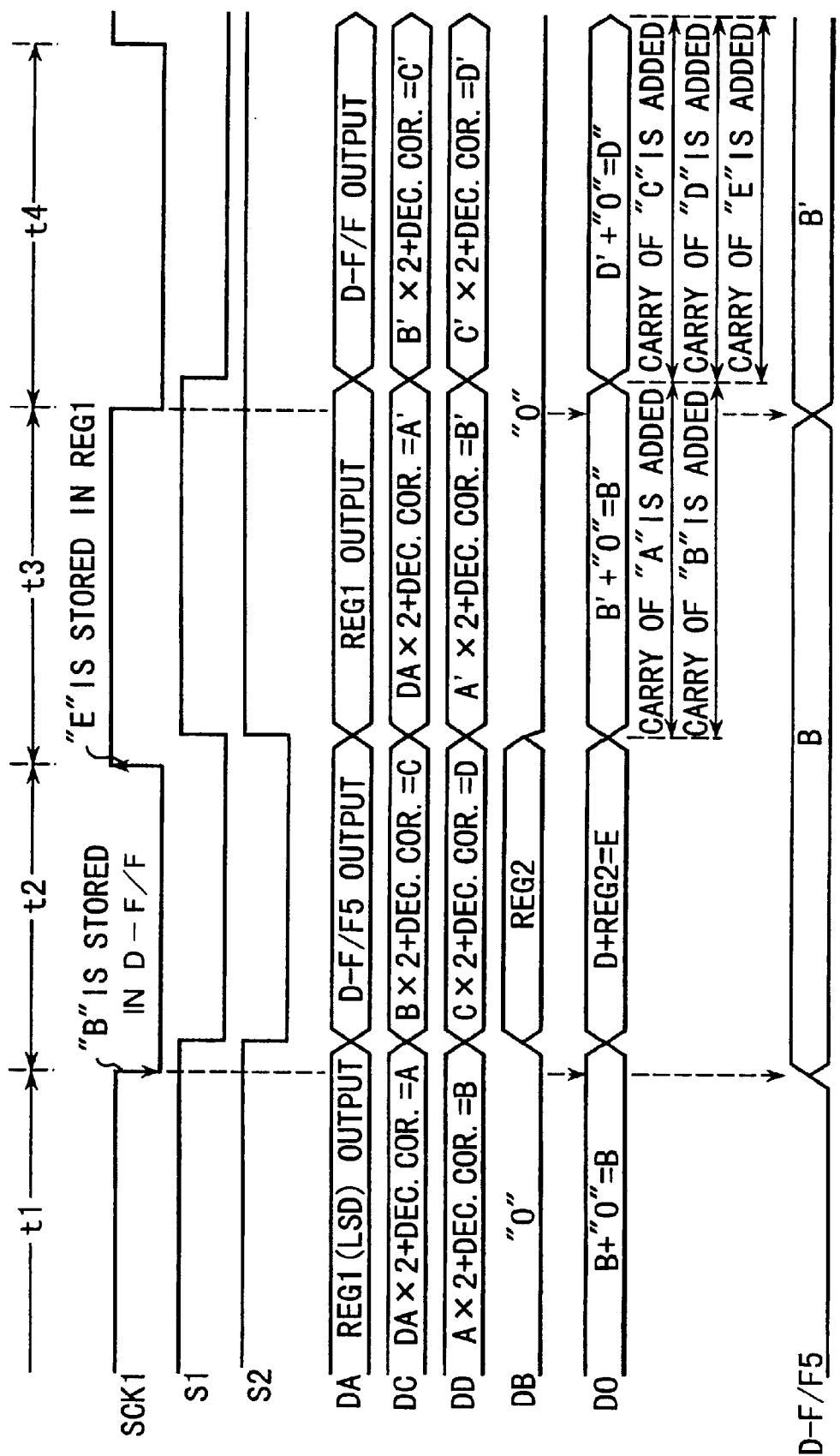
FIG. 10 shows a timing chart of the operation of the code translation circuit.

FIG. 10 shows a timing chart of the operation of the code translation circuit. In this circuit, two different operation processes are performed on the rising edge and the falling edge timing of the first shift clock SCK1, respectively. In the first half (t1) of the shift clock SCK1, the first selecting signal S1 is ⌈1⌋, and the following processes 1̂ to 4̂ are concurrently performed.

1̂ The first shift-register 1 is selected by the selector 3, and output thereof is supplied to the arithmetic/logic circuit 6.

2̂ The BCD data DA input to the arithmetic/logic circuit 6 is doubled and decimal corrected in the first doubling/decimal correcting circuit 11, whereby an operation result A is output.

3̂ The operation result A is further doubled and decimal corrected in the second doubling/decimal correcting circuit 12, whereby an operation result B is output.

4̂ The operation result B and ⌈0⌋ are added in the adding/decimal correcting circuit 13.

As a result, the process of quadrupling the data DA is performed in the first half (t1) of the shift clock SCK1. The intermediate result B obtained by this process is stored in the D-F/F 5 at the falling edge of the shift clock SCK1.

In the latter half (t2) of the shift clock SCK1, the first selecting signal S1 is ⌈0⌋. On each head timing when LSD is output from the first shift-register 1, the second selecting signal S2 also becomes to ⌈0⌋, whereby a BIN data is supplied from the second shift-register 2. Therefore, in the latter half (t2) of the shift clock SCK1, the following processes 1̂ to 5̂ are concurrently performed.

1̂ The intermediate result stored in the D-F/F 5 is selected by the selector 3 to be supplied to the arithmetic/logic circuit 6.

2̂ The output of the second shift register 2 is selected by the selector 4 to be supplied to the arithmetic/logic circuit 6.

3̂ The BCD data DA input to the arithmetic/logic circuit 6 is doubled and decimal corrected in the first doubling/decimal correcting circuit 11, whereby an operation result C is output.

4̂ The operation result C is further doubled and decimal corrected in the second doubling/decimal correcting circuit 12, whereby an operation result D is output.

5 The operation result D and the BIN data DB are added and decimal corrected in the adding/decimal correcting circuit 13, whereby a operation result E is output.

As a result, the process of quadrupling the intermediate result B and adding the resultant to the BIN data DB is performed in the latter half (t2) of the shift clock SCK1. The intermediate result B obtained by this process is stored in the D-F/F 5 at the falling edge of the shift clock SCK1. In other words, a process of DA×16+DB is performed in each period of the shift clock SCK1. The operation result E is stored in the first shift-register $1_N$.

The carry signals generated together with the operation results A and B in the period of t1 are reflected to the operation results A' and B' output in the following first half (t3) of the shift clock SCK1, respectively. Similarly, the carry signals generated with the operation results C, D and E in the period of t2 are reflected to the operation results C', D' and D" output in the following latter half (t4) of the shift clock SCK1, respectively.

Next, for an example of that a BIN data [0100 11010111 (4D7)] is stored in the second shift-register 2, and the BIN data is converted to a BCD data [0001 0010 0011 1001 (1239)], the detailed operation of the translation circuit will be described bellow.

Figure 11:
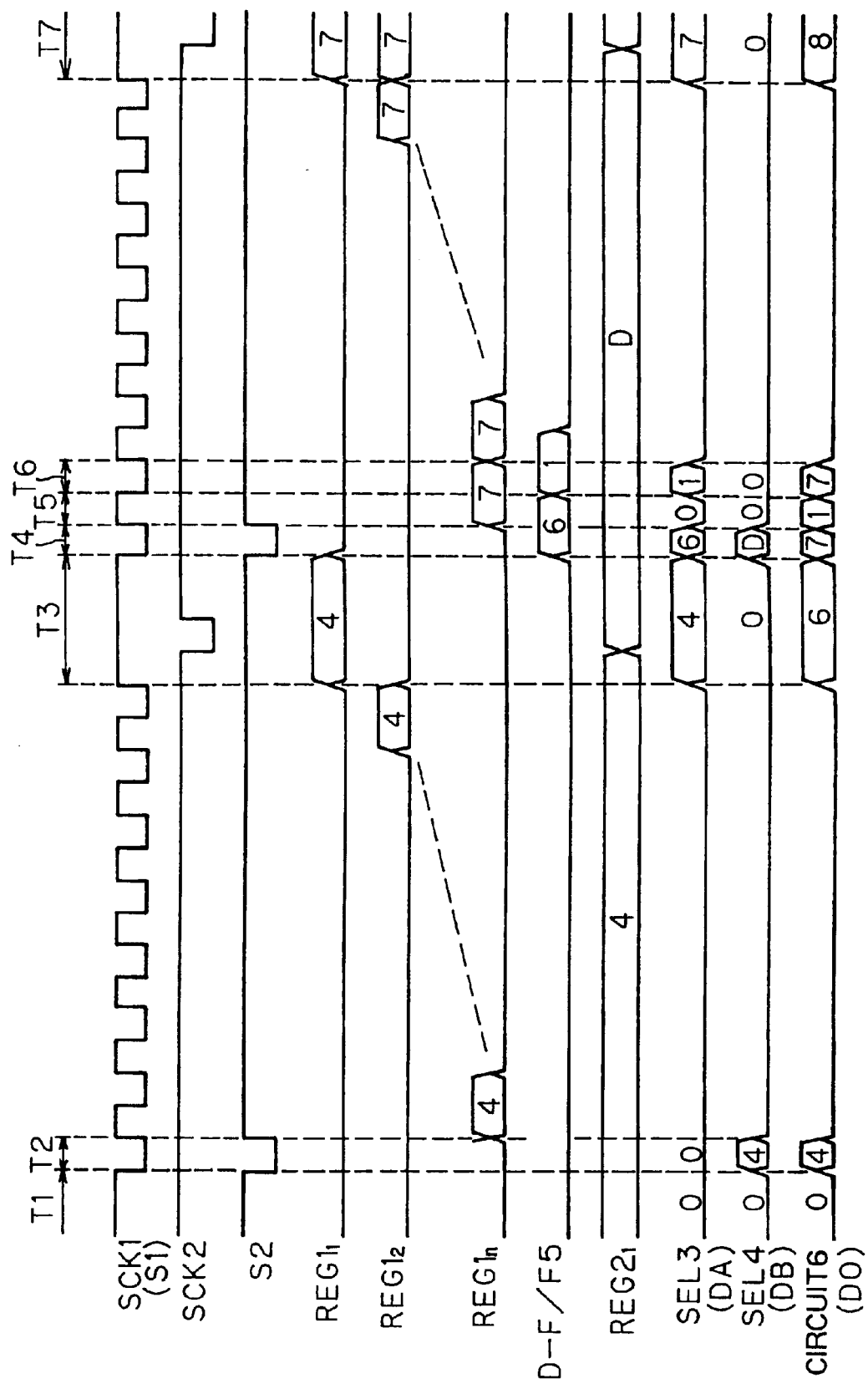
FIG. 11 shows a timing chart for explaining detailed operation of the code translation circuit.
Figure 12:
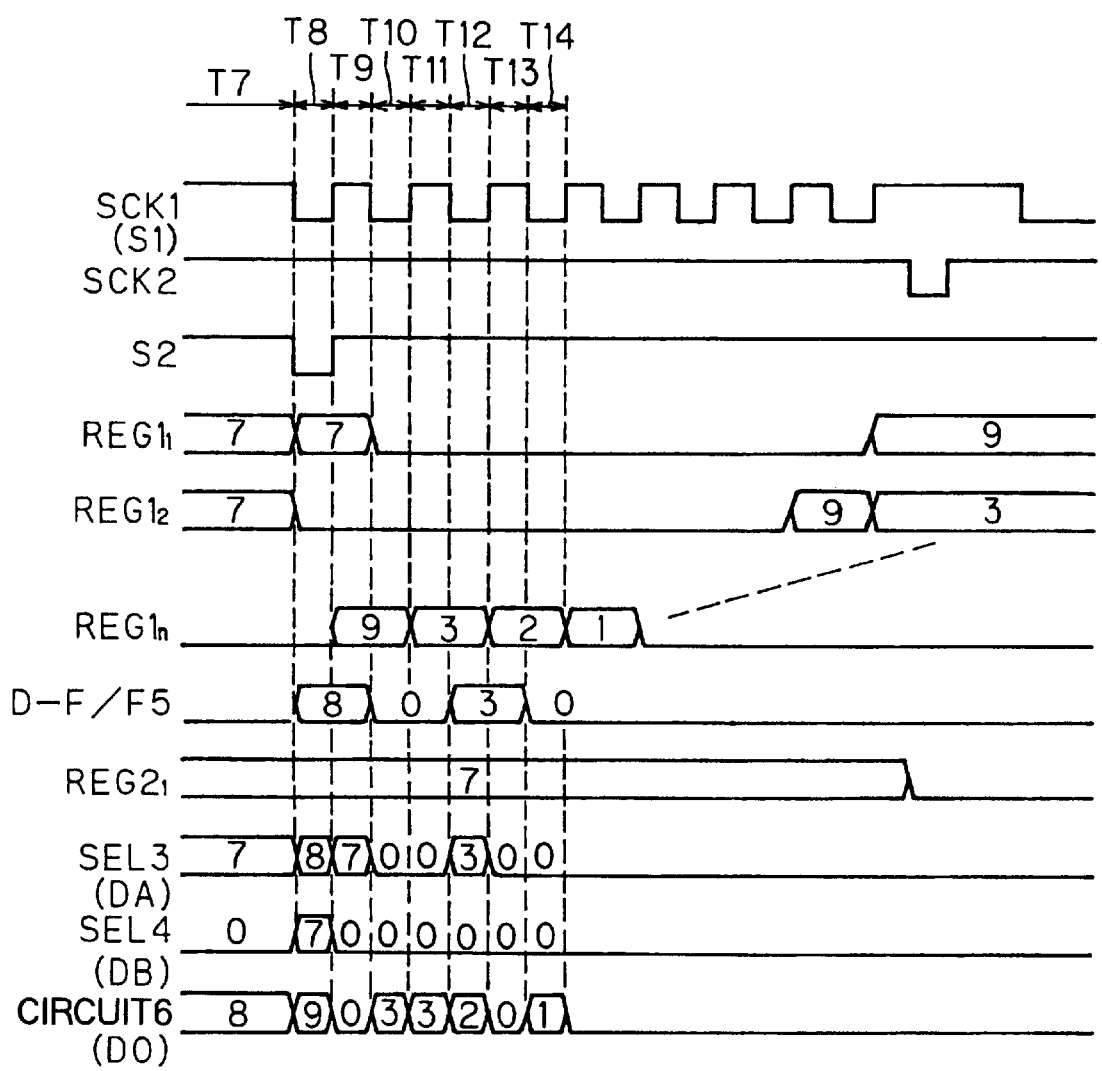
FIG. 12 shows a timing chart to be continued.

FIGS. 11 and 12 show the timing charts of the operation, and FIGS. 13A to 19B show the data states of the respective portions in the arithmetic/logic circuit 6, corresponding to the respective timings T1 to T14 in the timing charts.

Figure 13A:
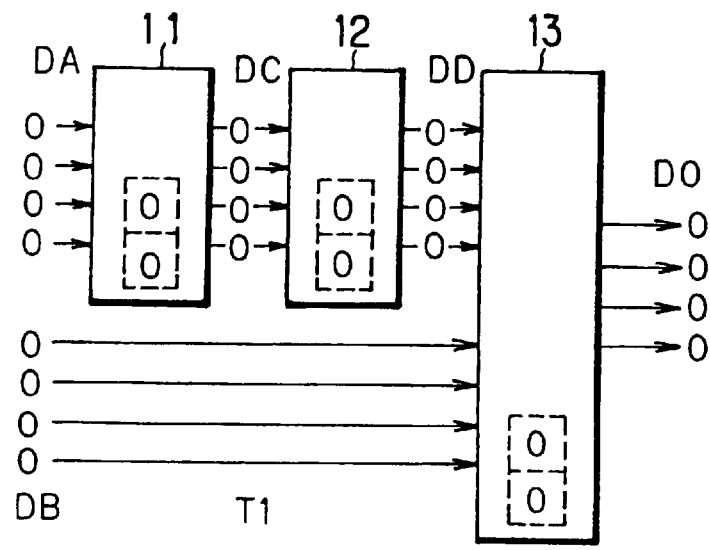
FIGS. 13A and 13B show data states of the arithmetic/logic circuit at timings T1 and T2 in the timing chart.

Timing T1 FIG. 13A

The operation for data DA [0000] output from the first shift-register 1 and data DB [0000] is processed. Since all carry signals are [0] in the initial state, DO [0000] is output to be stored in the D-F/F 5.

Figure 13B:
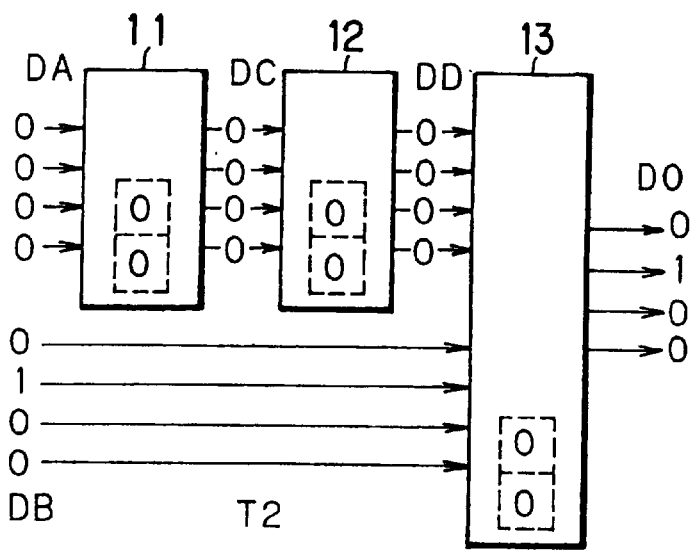

Timing T2, FIG. 13B

The output of the second shift-register 2 is selected. Thus, data DB [0100(4)] is added in the adding/decimal correcting circuit 13, whereby the output data DO becomes to [0100]. This output data DO is stored in the first shift-register $1_N$ at the end of the timing T2. Hereinafter, the data state is not changed until the data [0100(4)] is stored in the shift-register $1_1$.

Figure 14A:
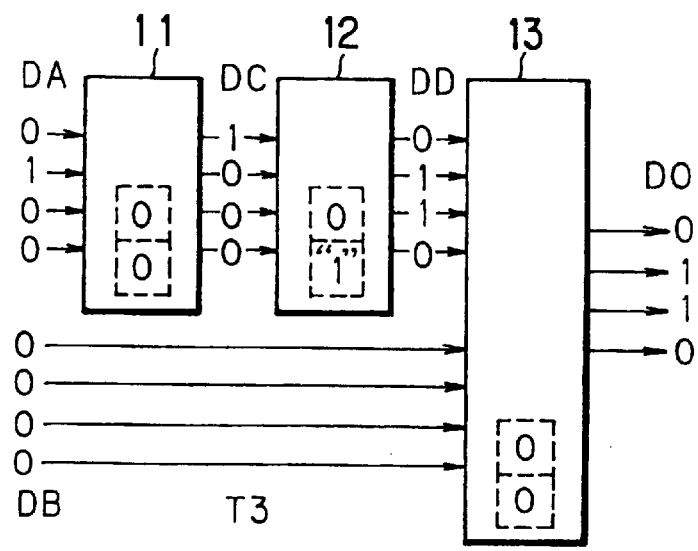
FIGS. 14A and 14B show data states of the arithmetic/logic circuit at timings T3 and T4 in the timing chart.

Timing T3, FIG. 14A

The data [0110 4)] stored in the shift-register $1_1$ serves as the data DA, and ×4 operation is processed for the data DA to generate a carry signal. As a result, the lower side latch circuit 25 in the second doubling/decimal correcting circuit 12 becomes to [1]. In FIGS. 13A to 19B, carry signals in the parentheses "" show changed ones. The output data DO is decimal corrected to be [0110($_6$)], and this is stored in the D-F/F 5.

Figure 14B:
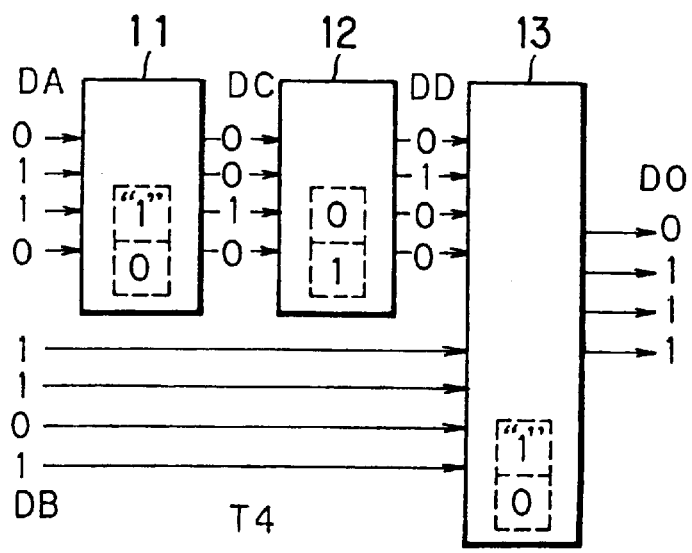

Timing T4, FIG. 14B

The data DA [0110(6)] output from the D-F/F 5 and the data DB (BIN data) [1101(D)] output from the second shift-register 2 are supplied to the arithmetic/logic circuit 6, respectively. In the first doubling/decimal correcting circuit 11, a carry signal is generated, and the data is decimal corrected to be [0010]. As a result, the upper side latch circuit 26 becomes to [1]. The data is further doubled in the second decimal correcting circuit 12 to be [0100]. The data [0100] is added to [1101] in the adding/decimal correcting circuit 13, whereby decimal corrected data [0111(7)] is output as data DO. In this timing, another carry signal is generated in the circuit 13. Thus, carry C1 is changed to [1]. The operation result is stored in the first shift-register $1_N$.

Figure 15A:
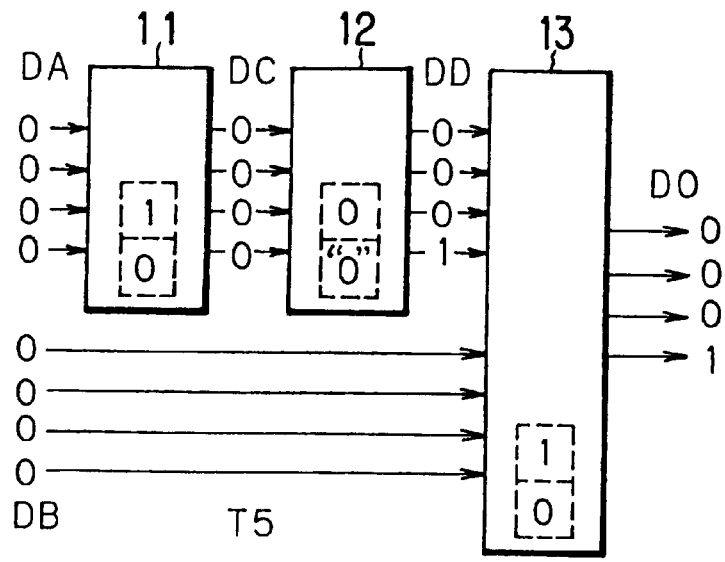
FIGS. 15A and 15B show data states of the arithmetic/logic circuit at timings T5 and T6 in the timing chart.

Timing T5, FIG. 15A

Both data DA and DB are [0000]. The carry signal [1] of the lower side latch circuit in the second doubling/decimal correcting circuit 12 are reflected to bring the data DD to be [0001]. At the same time, the lower side carry signal is changed to [0], and the data [0001] is stored in the D-F/F 5.

Figure 15B:
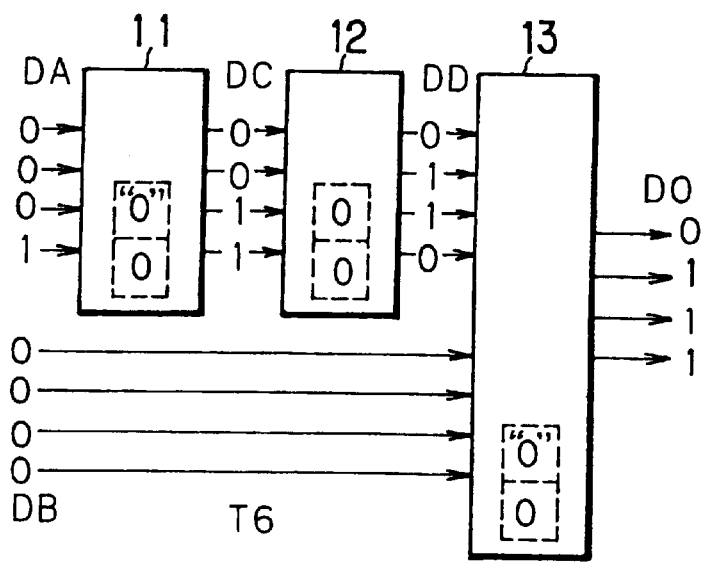

Timing T6, FIG. 15B

As the data DA and DAs the data DA and DB, [0001] a in the D-F/F 5 and [0000] are supplied to the arithmetic/ logic circuit 6, respectively. The first doubling/decimal correcting circuit 11 outputs [0011] as the data DC, because of that the upper side latch circuit 26 is [1]. Then, the latch circuit 26 is changed to [0]. In the adding/decimal correcting circuit 13, data [0110] and [0000] are input as the data DD and DB, respectively. In this timing, since carry C1=1 is remained in the circuit 13, the output data DO becomes to [0111(7)]. The output data DO is stored in the first shift-register $1_N$, and the data [0111(7)] in the shift-register $1_N$ is transferred to the shift-register $1_{N-1}$. From this time, there are no change of data states until the data [0111(7)] is stored in the shift-register $1_1$.

Figure 16A:
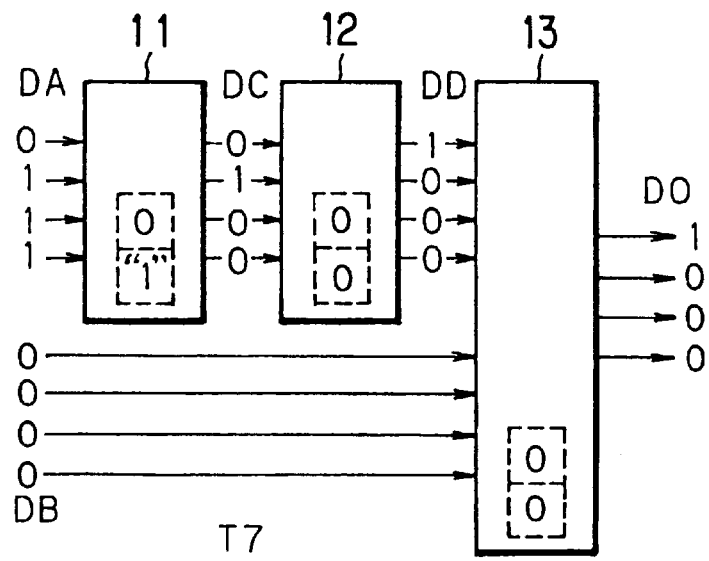
FIGS. 16A and 16B show data states of the arithmetic/logic circuit at timings T7 and T8 in the timing chart.
Figure 16B:
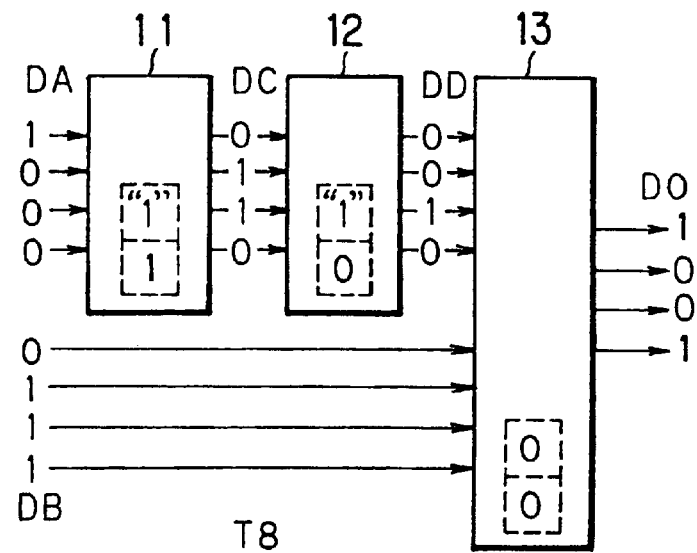
Figure 17A:
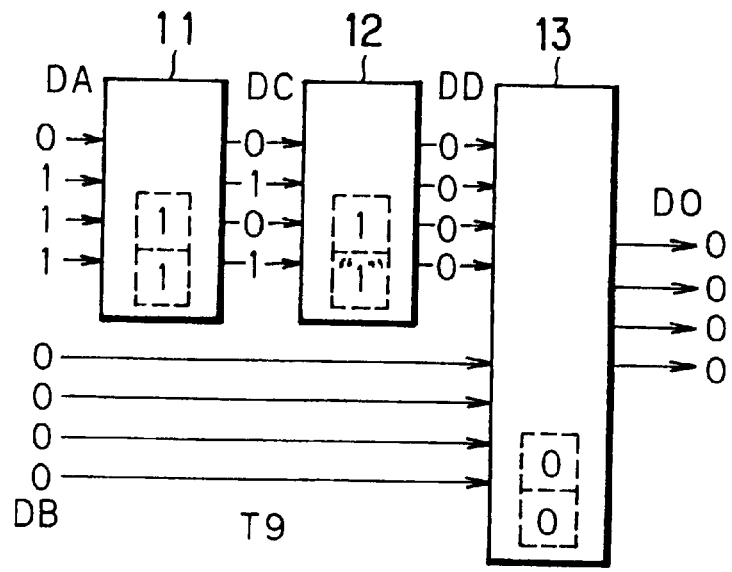
FIGS. 17A and 17B show data states of the arithmetic/logic circuit at timings T9 and T10 in the timing chart.
Figure 17B:
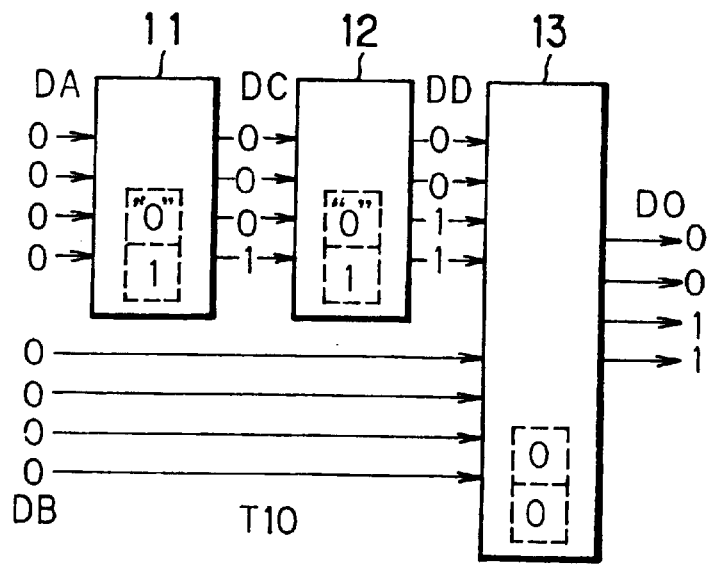
Figure 18A:
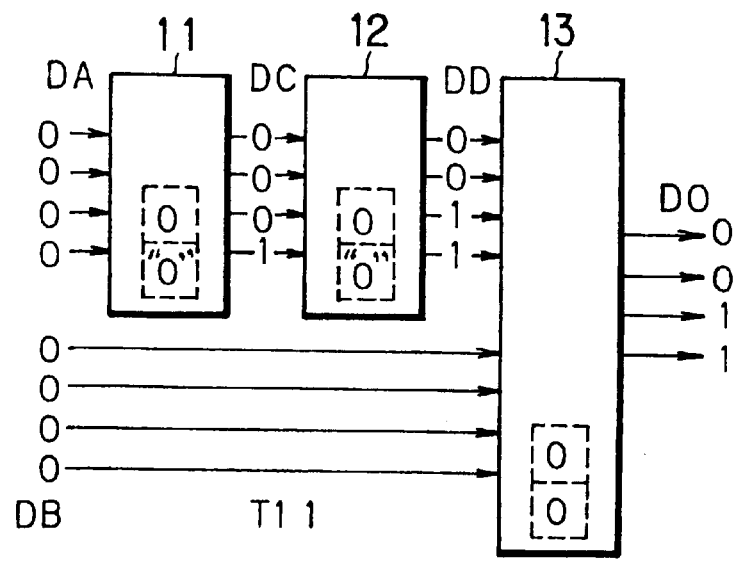
FIGS. 18A and 18B show data states of the arithmetic/logic circuit at timings T11 and T12 in the timing chart.
Figure 18B:
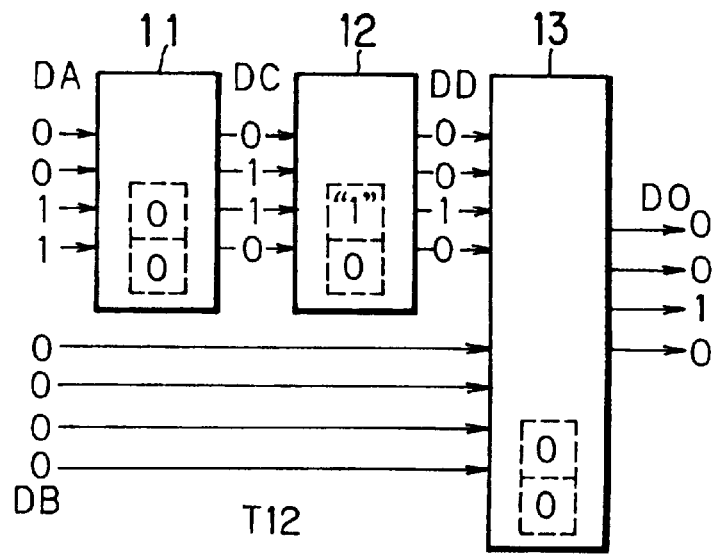
Figure 19A:
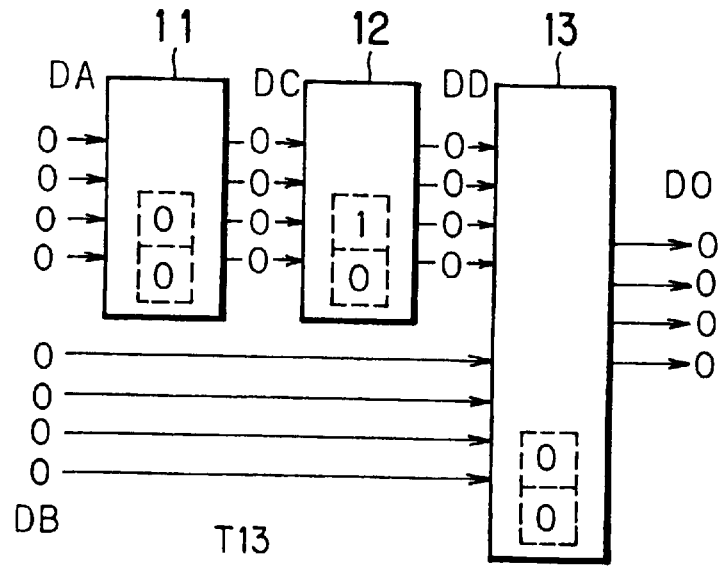
FIGS. 19A and 19B show data states of the arithmetic/logic circuit at timings T13 and T14 in the timing chart.
Figure 19B:
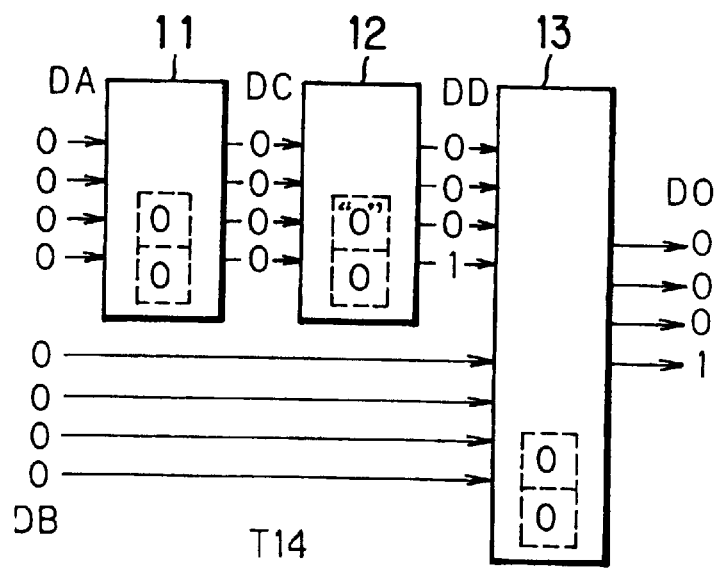

Timing T7, FIG. 16A

The data [0111(7)] transferred to the shift-register $1_1$ is supplied to the arithmetic/logic circuit 16 as the data DA. This data DA is processed through the doubling/decimal correcting circuits 11, 12 and the adding/decimal correcting circuit 13, whereby the output data DO becomes to [1000 (8)]. In this procedure, the latch circuit 25 in the first doubling/decimal correcting circuit 11 holds a carry Timing T8 to T14, FIGS. 16B to 19B From that time, the remaining translation processes are sequentially performed in the same manner. Finally, a translated data [1001(9)], [0011], [0010(2)] and [0001(1)] are stored in the first shift-registers $1_1$, $1_2$, $1_3$ and $1_4$, respectively. The sequential translation operations end by a stop signal (not shown).

In the embodiment described above, each of ×16 operations is divided into the first half and the latter half of the clock period. All of the input/output data of the arithmetic circuit and the stored data in the shift-registers are bound up 4 bits by 4 bits, whereby each of ×16 operations can be performed with a quadrupling (×4) circuit. Additionally, each carry signal is held in the arithmetic/logic circuit for a clock period, and then reflected to the operation process for the next digit. Therefore, the circuit construction can be remarkably simplified, and the circuit scale can be reduced.

Further, according to the embodiment, ×16 operation can be performed in one period of the first shift clock. Therefore, the operation process speed becomes 16 times as high as the conventional method. In addition to the high speed processing, the number of the shift stages and the frequency of the clock signal can be reduced, thereby reducing the power consumption of the code translation circuit.

What is claimed is:

1. A code translation circuit for converting a binary data to a binary coded decimal data, comprising:
   a first shift-register for finally storing a translated binary coded decimal data 4 bits by 4 bits from LSD, the first shift-register having 4 bits×N stages (where N is an arbitrary positive integer) and being shift-controlled by a first clock signal;
   a second shift-register for storing a to-be-translated binary data 4 bits by 4 bits from MSD, the second shift-register having 4 bits×M stages (where M is an arbitrary positive integer) and being shift-controlled by a second clock signal in such a manner that one stage is shifted in the second shift-register for each N stages shift in the first shift-register;

arithmetic/logic means for periodically processing a code translation in such a manner as to multiply each 4 bits data sequentially selected from MSD of the to-be-translated binary data by 16 and add the resultant to the subsequent 4 bits data, thereby outputting the translated binary coded decimal data, the code translation including (a) a first process for quadrupling each 4 bits data from the first shift-register with decimal correction and carry processing to output an intermediate result in the first half of each period of the first clock signal, and (b) a second process for quadrupling each of the intermediate result with decimal correction and carry processing and adding the resultant to 4 bits data from the second shift-register so as to output the translated binary coded decimal data to be stored in the first shift-register in the latter half of each period of the first clock signal; and a buffer register for temporarily storing each of the intermediate result output from the arithmetic/logic means.

2. The code translation circuit according to claim 1, wherein the arithmetic/logic means is:

to process a first code translation for each 4 bits data output from the first shift-register to output and store the intermediate result in the buffer register in the first half of each period of the first clock signal, and to process a second code translation for each of the intermediate data output from the buffer register to store the translated data in the first shift-register in the latter half of each period of the first clock signal, said first code translation being to quadruple the 4 bits data with decimal correction and carry processing, the second code translation being to (a)quadruple the intermediate result with decimal correction and carry processing, (b)add the resultant to 4 bits data output from the second shift-register with decimal correction and carry processing, when the 4 bits data from the first shift-register is LSD, and (c)add the resultant to zero with decimal correction and carry processing, when the 4 bits data from the first shift-register is not LSD, wherein the arithmetic processing in the arithmetic/logic means is periodically performed until all of the data stored in the second shift-register, which is to be translated, is output, whereby the translated data is stored in the first shift-register.

3. The code translation circuit according to claim 1, wherein the arithmetic/logic means comprises;

a first doubling/decimal correcting circuit for doubling 4 bits data alternately output from the first shift-register and the buffer register, with decimal correction and carry processing;

a second doubling/decimal correcting circuit for doubling 4 bits data output from the first decimal correcting circuit with decimal correction and carry processing; and an adding/decimal correcting circuit for adding 4 bits data output from the second doubling/decimal correcting circuit to 4 bits data output from the second shift-register or zero with decimal correction and carry processing.

4. The code translation circuit according to claim 3, wherein each of the first and second doubling/decimal correcting circuits includes;

a first carry holding portion for holding a carry generated by processing in the first half of a period of the first clock signal for the period of the first clock signal, then adding the carry to LSB of the data processed in the first half of the period in the processing of the following period of the first clock signal; and a second carry holding portion for holding a carry generated by processing in the latter half of a period of the first clock signal for the period of the first clock signal, then adding the carry to LSB of the data processed in the latter half of the period in the processing of the following period of the first clock signal.

5. The code translation circuit according to claim 1, further comprising:

a first selecting means for alternately selecting the 4 bits data sequentially output from the first shift-register and the intermediate result output from the buffer register to supply the selected data to the arithmetic/logic means, the first selecting means being driven by a first selecting signal with the same period as the first clock signal; and a second selecting means for selecting the 4 bits data sequentially output from the second shift-register to supply the selected data to the arithmetic/logic means, the second selecting means being driven by a second selecting signal output for each N period of the first selecting signal.

* * * * *